United States Patent [19]

Elabd

[11] Patent Number: 4,659,226
[45] Date of Patent: Apr. 21, 1987

[54] METHOD OF MAKING A SEMICONDUCTOR DEVICE

[75] Inventor: Hammam Elabd, East Windsor Township, Mercer County, N.J.

[73] Assignee: RCA Corporation, Princeton, N.J.

[21] Appl. No.: 804,383

[22] Filed: Dec. 4, 1985

[51] Int. Cl.$^4$ .............................................. G01B 11/00
[52] U.S. Cl. .................. 356/401; 250/491.1; 355/53
[58] Field of Search ....................... 356/399, 400, 401; 250/491.1, 548, 561; 355/43, 53, 54; 378/34, 35, 205, 206

[56] References Cited

U.S. PATENT DOCUMENTS

| | | | |
|---|---|---|---|
| 3,684,384 | 8/1972 | Hojo et al. | 356/399 |
| 4,236,098 | 11/1980 | Horak et al. | 350/317 |
| 4,266,334 | 5/1981 | Edwards et al. | 29/583 |
| 4,309,813 | 1/1982 | Hull | 29/580 |
| 4,362,389 | 12/1982 | Koizumi et al. | 356/401 |
| 4,362,575 | 12/1982 | Wallace | 148/1.5 |
| 4,388,128 | 6/1983 | Ogawa et al. | 156/64 |
| 4,408,885 | 10/1983 | Johannsmeier et al. | 356/401 |
| 4,419,013 | 12/1983 | Heimer | 356/401 |
| 4,534,620 | 8/1985 | Gale et al. | 350/166 |
| 4,588,899 | 5/1986 | Erhardt | 250/491.1 |

OTHER PUBLICATIONS

Dahlke et al., *IBM Technical Disclosure Bulletin*, vol. 13, No. 5, Oct. 1970, p. 1069.

Primary Examiner—F. L. Evans
Attorney, Agent, or Firm—Birgit E. Morris; Donald S. Cohen

[57] ABSTRACT

There is disclosed herein a method of making a device made up of at least two separate parts each of which is formed of a patterned array with the parts being mounted one on the other, with the patterned arrays of the parts being aligned, such as a CCD imager having a color filter thereon. The two parts are made on separate substrates with a first alignment key being formed on each substrate. The first alignment keys are formed by photolithography using the same mask to form the first alignment keys on each substrate. The various features of each of the parts are then formed on each substrate with each feature being formed by a photolithographic step using a mask which is aligned to a first alignment key so as to align all the features. A second alignment key is formed on each substrate and is positioned on each substrate in the same relationship with a first alignment key. The second alignment keys are of a material and construction so as to be visible when radiation of a desired wavelength is directed through the substrates. A part formed on one of the substrates is placed over a part formed on the other substrate. Radiation is directed through the substrates and the second alignment keys are aligned so as to align the patterned array of the two parts.

12 Claims, 8 Drawing Figures

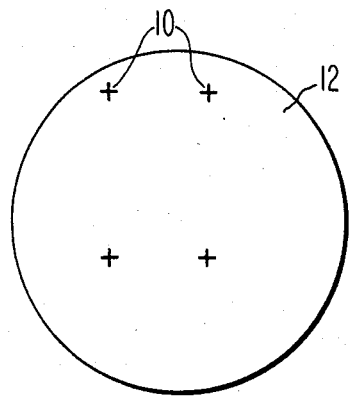
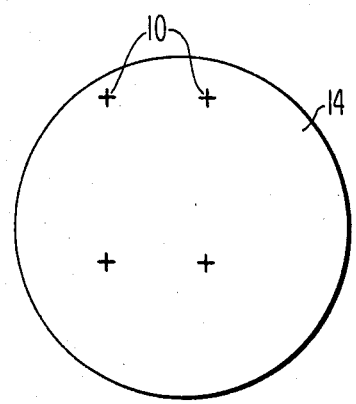
Fig. 1aFig. 1b
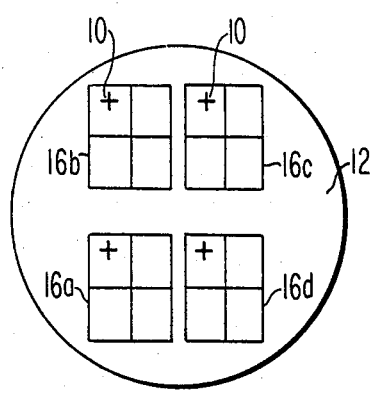
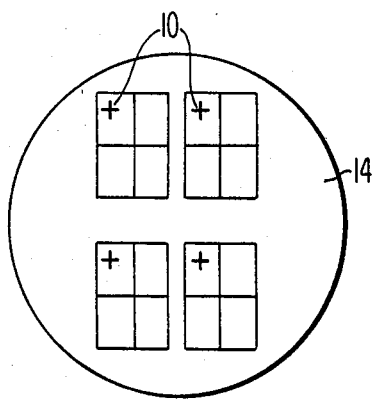
Fig. 2aFig. 2b
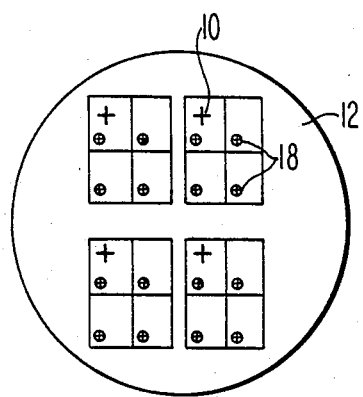
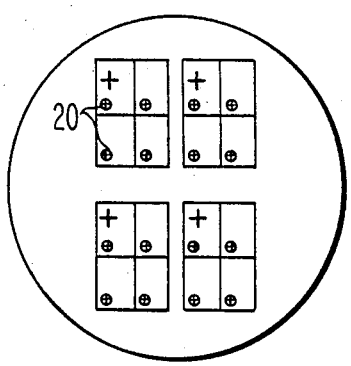
Fig. 3aFig. 3b

METHOD OF MAKING A SEMICONDUCTOR DEVICE

The invention described herein was made in the performance of work under NASA Contract No. NAS5-27800 and is subject to the provisions of Section 305 of the National Aeronautics and Space Act of 1958 (72 Stat. 435; 42 U.S.C. 2457).

The present invention relates to a method of making a semiconductor device, and, more particularly, to a method of making a semiconductor device which includes two or more separate parts which are secured together in an aligned relation.

BACKGROUND OF THE INVENTION

There are various semiconductor devices which include at least two separate parts which are secured together in an aligned relation. For example, there are semiconductor imagers, such as charge-coupled device (CCD) imagers, which are formed of an array of detector elements in an and along the surface of a substrate and which have a supplemental part, such as a filter, lenticular array, or a radiation shield for sensors or optical signal processors, mounted on the image substrate. The supplemental part also includes an array formed on and along a surface of a substrate. The supplemental part is mounted on the imager with the array of the supplemental part being aligned with the array of the imager. Generally, each of the parts, such as the imager and a filter, is made by a number of different steps in which various patterned layers or regions are formed in or on the substrate surface with each layer or region being aligned with previously formed patterned layers or regions. The steps forming the two parts are generally different since the structure of the two parts are different. Thus each part requires some type of alignment means to form the various layers or regions which make up the part. Finally, the final device requires some type of alignment means to align the two parts with respect to each other. If the details of one or both parts are made up of very fine lines, the details themselves cannot be used in an optical alignment operation since they cannot be seen very well in a low magnification large field of view microscope of the type generally used for alignment purposes. Therefore, it becomes necessary to provide the parts with large alignment keys to achieve alignment in the x, y and z directions.

SUMMARY OF THE INVENTION

A method of making a device which includes at least two parts each having a patterned array along a surface of a substrate with the parts being mounted one on the other, with the array on one being aligned with the array on the other, includes forming on the substrate of each of the parts a first alignment key using the same photolithographic mask. The features which make up the patterned array of the part on each of the substrates are formed on the substrate with each feature being aligned to the first alignment key. A second alignment key is formed on each of the substrates with each of the second alignment keys having the same relation to the first alignment key. The substrates of the parts are then placed over each other and the second keys of the substrates are aligned to align the arrays of the parts with each other.

BRIEF DESCRIPTION OF THE DRAWING

FIGS. 1A, 2A and 3A are schematic views illustrating the steps of the method of the present invention for forming one of the parts of the semiconductor device.

FIGS. 1B, 2B and 3B are schematic views illustrating the steps of making the other part.

DETAILED DESCRIPTION OF PREFERRED EMBODIMENT

Figure 4:
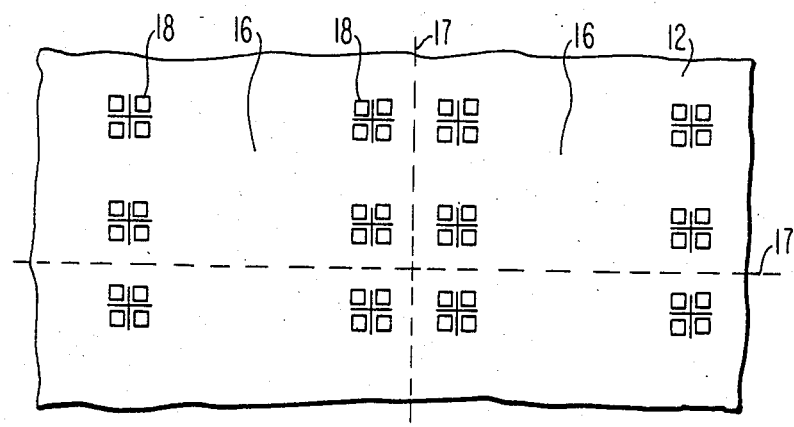
FIG. 4 is a top view of a portion of a wafer showing second alignment keys thereon.

The method of the present invention will be described with regard to forming a solid state imager which includes a CCD imager having a filter mounted thereon to achieve color imaging. However, it should be understood that the present invention can be used to make any type of device which includes two separate parts made separately and then mounted together with an alignment of one to the other being required.

A typical CCD imager is formed in a substrate of P type conductivity single crystalline silicon. As shown in U.S. Pat. No. 4,362,575 to L. F. Wallace entitled "Method Of Making Buried Channel Charge Coupled Devices With Means Controlling Excess Charge", issued Dec. 7, 1981, one type of CCD imager will include a plurality of spaced parallel channel regions of N type conductivity in the substrate and extending along a surface thereof. Between the channels are drains of N+ type conductivity and between each drain and each adjacent channel region is a barrier region. A layer of a dielectric material, such as silicon oxide, covers the surface of the substrate, and on the dielectric layer are a plurality of parallel conductive gates. The gates are strips of a conductive material, such as conductive polycrystalline silicon, which extend transversely across the channel regions.

In making a CCD imager, the various regions within the substrate are formed in separate steps wherein a masking layer is provided over the surface of the substrate and is provided with openings therethrough where each region is to be formed. A conductivity modifier is then embedded into the substrate through the openings in the masking layer to form the regions. The masking layer may be a layer of a photoresist in which the openings are formed by photolithography. The masking layer may be of other materials, such as silicon oxide, with openings being formed by coating the layer with a photoresist which is defined by photolithography. The gates are generally formed by applying a layer of the gate material over the entire surface of the dielectric layer. A layer of photoresist is applied over the gate material and is defined by photolithography to leave photoresist over only the portions of the gate material which are to remain. The remaining portions of the gate material are then removed with a suitable etchant. For each of the photolithographic steps, a mask having the desired pattern is placed over the photoresist layer with the pattern being aligned with the features of the CCD already formed in or on the substrate so that the new features will be aligned with those already formed. Thus, the making of the CCD requires the use of a number of steps each of which requires the alignment of a mask to features already on the substrate of the CCD.

The filters are formed of a plurality of layers of filter material, each capable of filtering a particular wavelength of light, coated on a transparent substrate and defined into a particular pattern corresponding to the pattern of the CCD imager. The filters can be made by applying the various layers of filter material on the substrate in succession and individually defining each layer into the desired pattern. The defining of each layer includes applying a layer of photoresist over the filter material layer, placing a mask with the pattern thereon over the photoresist layer, directing light through the mask onto the photoresist layer, and then developing the photoresist layer. Using the photoresist layer as a mask, the exposed portion of the filter material layer is removed, such as by plasma etching, to define the pattern of the layer. Another technique used to form the pattern filter layers is a lift-off technique wherein a layer of a photoresist is applied over the substrate surface, openings are photolithographically defined in the photoresist layer where the pattern of the filter layer is to be provided, the filter layer is coated over the photoresist layer and in the openings, and then the photoresist layer is removed leaving only the pattern of the filter layer which is in the openings in the photoresist layer.

Still another technique is described in U.S. Pat. No. 4,534,620 to M. T. Gale et al. entitled "Standarized Multi-Stack Dielectric-Layer Filter Blank And Method For Fabricating Color-Encoding Filter Therefrom", issued Aug. 13, 1985. In this technique, all of the layers are coated on the substrate to form a stack of the layers. Various portions of one or more of the layers are then removed, such as by etching, to define the layers in the desired pattern. For each of the etching steps, a layer of a photoresist is coated on the stack and is photolithographically defined to expose the area of the stack to be removed. Thus, forming the filter, like forming the CCD imager, requires the use of a plurality of photolithographic steps wherein a mask having a pattern thereon is placed over a photoresist layer and must be aligned with a previous features formed on a substrate.

In the method of the present invention, the first step is to form a first alignment key 10 on the wafer 12 of semiconductor material, such as single crystalline silicon, on which the CCD imagers are to be formed and on the substrate 14 on which the filters are to be formed as shown in FIGS. 1A and 1B. As will be explained, the CCD imagers will be formed in groups, such as a group of four, with a plurality of groups being formed on the wafer 12. Thus, a first alignment key 10 is formed on the wafer 12 for each group to be formed. As shown in FIG. 1A, there are four first keys 10 to form four groups in the wafer 12. Likewise, there is a separate first key 10 formed on the filter substrate 14 for each group of filters to be formed, as shown in FIG. 1B. The first keys 10 are formed so that they will remain during the entire manufacture of either the CCD imagers or the filters. The first keys 10 may be formed of a thick layer of an insulating material, such as silicon oxide, or as a deep groove in the wafer 12 or substrate 14, or of an etch resistant metal, such as chromium on the substrate 14. In either case, the first keys 10 are formed photolithographically using a single mask to form all the first keys 10 on each of the wafer 12 and substrate 14, e.g. using a projection aligner, and, more importantly, using the same mask to form the first keys 10 on both the wafer 12 and the substrate 14.

To form the first keys 10 of silicon oxide, a layer of silicon oxide is deposited or formed on a surface of the wafer 12 or substrate 14. A layer of photoresist is coated over the silicon oxide layer. A mask having the pattern of the first keys 10 thereon is placed over the photoresist layer and light is directed through the mask onto the photoresist layer to expose the photoresist layer except for the areas to form the first keys 10. The photoresist layer is then developed to remove the exposed area leaving areas in the form of the first keys 10. The exposed area of the silicon oxide is then removed with a suitable etchant leaving the first keys 10 on the wafer 12 or substrate 14. A metal film first key 10 can be formed on the substrate 14 using a standard lift-off technique.

The CCD imagers are then formed in the wafer 12. As previously described, the CCD imagers are formed by a plurality of steps each of which utilizes a photolithographic step to define a pattern which results in the formation of some feature of the CCD imager. To prevent damage to the photoresist layer and to the mask, projection printing is used in each photolithographic step. To achieve the fine definition required, a step and print technique is used. The step and print technique uses a mask having thereon the pattern for one group of the CCD imagers being formed. The mask, which has an alignment key as part of its pattern, is first aligned with one of the first keys 10 on the wafer 12 and the photoresist exposed through the mask to form the pattern of one group of CCD imagers, such as the group 16a shown in FIG. 2A. The wafer 12 is then moved until the mask is aligned with the second first key 10 and the photoresist is again exposed through the mask to form the pattern of the second group 16b of the CCD imagers. This operation is repeated to form the groups 16c and 16d with a mask being aligned with the first key 10 for each group. This operation is repeated to form each feature of the CCD imagers with the mask for forming each feature being aligned with the first keys 10 so that all of the features are aligned with respect to each other.

During the formation of one of the features of the CCD imagers or as a separate step, a second alignment key 18 is formed on the wafer 12. As will be described, a second key 18 can be provided for each group 16a-16d of CCD imagers or for each imager in each group. As shown in FIG. 3A, there is one second key 18 for each group of CCD imagers. The second keys 18 are arranged so that they are all positioned in the same manner with respect to a first key 10 as are thereby positioned in the same manner with respect to the features of the CCD imagers. The second keys 18 are of a size and material which allow them to be seen when radiation of a desired wavelength is directed through the material of the wafer 12. Thus, the second keys 18 should be of material which is opaque to the wavelength of radiation in the visible or infrared to which the wafer 12 is transparent. In general, the second keys 18 can be of a metal, such as chromium. Also, although the second keys 18 must be of a shape to provide for alignment in the direction of the plane of the wafer 12, the x, y and $\theta$ directions, it can also be of a shape to provide for alignment in the z direction, the spacing between the images and the filters.

The filters are made in substantially the same manner as the CCD imagers. Each layer of the filters are defined into its pattern using a mask which is aligned with a first key 10 on the substrate 14. Thus, all the layers are patterned by being aligned with a first key 10 so that all the patterns are aligned with regard to each other. Either during the formation of one of the layers, or as a separate step, a second alignment key 20 is formed on the substrate 14, one for each group of filters or one for each filter. Each second key 20 is positioned in the same manner with respect to a first key 10 so that the second keys 20 are all positioned in the same manner with regard to the patterns of the layers of the filters. The second keys 20 are also of a size and material that they can be seen by radiation directed through the substrate 14. Preferably, the second keys 20 are of the same size and pattern as the second keys 18 on the wafer 12.

The next operation is to mount the filters on the CCD imagers and align them. Although this can be done by mounting a substrate 14 on a wafer 12, it is preferable to divide the wafer 12 and/or the substrate 14 into either groups of the CCD imagers or filters or into individual imagers and filters since the yield of the filters from a single substrate is generally lower than the yield of images from a wafer. Thus, by using smaller groups of the filters only the good areas can be used. If the wafer 12 and/or substrate 14 is divided into groups of the CCD imagers and filters, then a single key 18 and 20 respectively can be provided for each group. However, if the wafer 12 and/or substrate 14 is divided into individual CCD imagers or filters, then a separate second key 18 and 20 must be provided for each CCD imager and filter. Assuming, for example, that the wafer 12 and substrate 14 are divided into groups of CCD imagers and filters, the portion of the substrate 14 having the group of filters thereon is placed over the portion of the wafer 12 having the group of CCD imagers thereon with a thin layer of cement therebetween. Radiation of a desired wavelength is directed through the laminate of the portion of wafer 12 and portion of substrate 14, and the laminate is viewed from the side opposite the source of radiation, such as through a microscope. The piece of wafer 12 and piece of substrate 14 are then moved with respect to each other until the second alignment keys 18 and 20 are aligned with each other. Under appropriate conditions the alignment can also be achieved by top illumination using reflection from the two structures. Since the first alignment keys 10 were formed on both the wafer 12 and substrate 14 from the same mask, and the features forming the pattern of both the CCD imagers and the filters were formed by alignment to the first keys 10, and the second alignment keys 18 and 20 were formed by alignment to the first keys 10, when the second keys 18 and 20 are aligned with respect to each other, the patterns of the filter will be automatically aligned with the pattern of the CCD imagers.

Although the present invention has been described with providing on each wafer 12 or substrate 14 a single second alignment key 18 and 20 respectfully for each device or group of devices, a plurality of second alignment layers can be provided for each device or group of devices. A plurality of second alignment keys for each device or group of devices can be used to define the area of the device or group of devices when the wafer or substrate is divided into the individual devices or group of devices. For example, FIG. 4 shows a portion of a wafer 12 having a plurality of groups 16 therein. The second alignment keys 18 are formed at the corners of the areas in which each group 16 is found so as to outline the group. Thus, when the wafer 12 is divided, such as by wire saw cutting, the cut is made along lines between the second alignment keys 18 as indicated by dash lines 17 in FIG. 4. Thus, the second alignment keys 18 serve not only to achieve alignment between the group 16 and another part but also to properly define the physical borders of the group 16.

Figure 5:
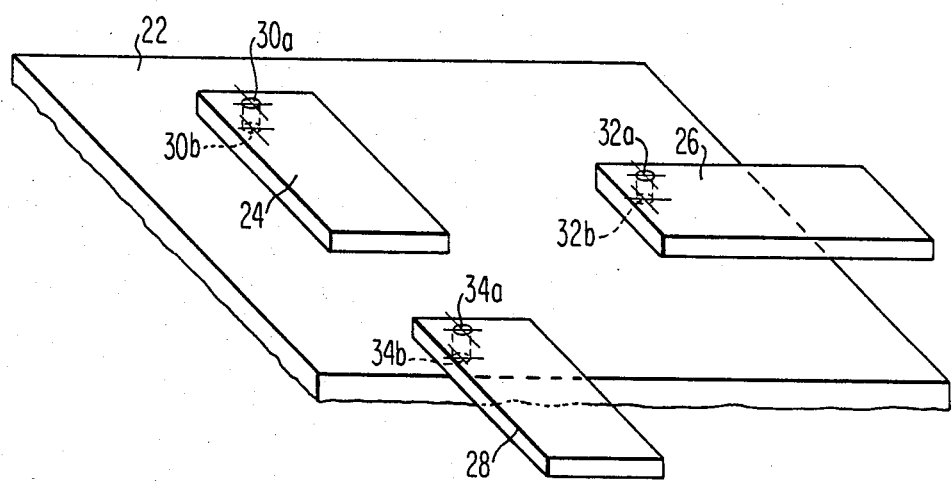
FIG. 5 is a perspective view showing the use of the method of the present invention for mounting a plurality of parts together.

Also, although the present invention has been described with regard to aligning two parts together, such as the CCD imager and a filter, it can be used to align more than two parts. For example, it may be necessary to form the filters on separate substrate and then mount each substrate on the imager with each filter aligned with the imager. Also, it may be desirable to mount a lenticular array over the imager in addition to a filter. Thus, the three parts would be mounted one on the other and aligned with regard to each other by second alignment keys on the various parts. In addition, it is not necessary that all of the parts be mounted on top of each other. For example, in FIG. 5 there is shown a first part 22, such as a CCD imager, having three second parts 24, 26 and 28 mounted thereon and aligned therewith. One second part 24 may be a filter which is mounted over a portion of these detector areas of the imager and which has a second alignment key 30a aligned with a corresponding second alignment key 30b on the first part 22. Another second part 26 may be a different filter which is over a different portion of the detector area of the imager and which has a second alignment key 32a aligned with a corresponding second alignment key 32b on the first part. The final part 28 may be a radiation shield which extends over a non-detector portion of the imager and which has a second alignment key 34a aligned with corresponding second alignment key 34b on the first part 22.

Thus, there is provided by the present invention a method of making two separate parts, such as a CCD imager and a filter, which can be easily secured together and accurately aligned with respect to each other. In addition to providing ease of alignment of the parts, the present invention allows for great latitude as to how each of the specific parts is made. For example, the features of one of the parts, such as the CCD imager, can be made using a step and repeat photolithographic technique whereas if the other part, such as the filter, is not too complicated in design, it can be made using a single mask for the whole substrate and either a projection or contact printing photolithographic technique. No matter how the two parts are made, it is necessary that a first alignment key be formed on the wafer or substrate for each part from the same mask to form as a basis for all future alignment steps. The first alignment key should be of a construction that it will be useable during all following steps of forming the features of the parts. The features of the parts are then all made by alignment to the first alignment key. Finally, a second alignment key is formed on each wafer or substrate which have common position arrangement with regard to the first key. The second alignment keys should be of a size, design and material which make them visible during the alignment of the two parts.

I claim:

1. In a method of making a device which includes at least two parts each having a patterned array along a surface of a substrate with the parts being mounted one on the other with the array on one being aligned with the array on the other, the steps of:

forming on the substrate of each of the parts a first alignment key using the same photolithographic mask, forming on each of the substrates the features which make up the patterned array of the part being formed on the substrate with each feature being aligned to said first alignment key, forming on each substrate one or more second alignment keys with each of said second alignment keys being positioned in the same manner with regard to said first alignment key, placing the substrate of one of the parts over the substrate of the other part, and aligning the second alignment keys on the two substrates to align the array of one part with the array of the other part.

2. A method in accordance with claim 1 in which each part is made up of a number of features each of which is formed by a photolithographic step using a mask which includes an alignment key which is aligned to said first alignment key.

3. A method in accordance with claim 2 in which said first alignment key is made of a construction which remains during all of the steps of forming all of the features of the parts.

4. A method in accordance with claim 3 in which said first alignment key on at least one of the substrates is made of a thick layer of a material.

5. A method in accordance with claim 3 in which said first alignment on at least one of the substrates is made as a deep recess in the substrate.

6. A method in accordance with claim 3 in which the second alignment keys are of a material and construction so as to be visible when radiation of a desired wavelength is directed through the substrates.

7. A method in accordance with claim 1 wherein a plurality of first alignment keys are formed on each substrate and at least one part is formed on each substrate for each first alignment key.

8. A method in accordance with claim 7 in which the parts on each substrate are made in groups of a plurality of parts with each group being aligned with a separate first alignment key.

9. A method in accordance with claim 8 in which there is formed on the substrates at least one second alignment key for each group of parts.

10. A method in accordance with claim 9 in which each substrate is divided into portions containing a group of said parts and the portion of the substrate containing a group of one of the parts is placed over the portion of the substrate containing a group of the other parts and the parts are aligned by the second alignment keys on the portions of the substrates.

11. A method in accordance with claim 8 in which there is formed on the substrate a second alignment key for each of the parts thereon.

12. A method in accordance with claim 11 in which at least one of the substrates is divided into portions and containing one part and each portion of said one substrate is placed over a portion of the other substrate which contains one part and the two parts are aligned by the second alignment keys thereon.

* * * * *